United States Patent
Fink et al.

(10) Patent No.: US 10,429,427 B2
(45) Date of Patent: Oct. 1, 2019

(54) METHOD AND DEVICE FOR DETERMINING THE STATE OF AN ELECTRICALLY CONTROLLED VALVE

(75) Inventors: Sven Fink, Linden (DE); Matt Saterbak, Robbinsdale, MN (US)

(73) Assignee: Danfoss Power Solutions GmbH & Co. OHG, Neumünster (DE)

( * ) Notice: Subject to any disclaimer, the term of this patent is extended or adjusted under 35 U.S.C. 154(b) by 833 days.

(21) Appl. No.: 13/816,307

(22) PCT Filed: Aug. 4, 2011

(86) PCT No.: PCT/DE2011/075186
§ 371 (c)(1),
(2), (4) Date: Mar. 13, 2013

(87) PCT Pub. No.: WO2012/041308
PCT Pub. Date: Apr. 5, 2012

(65) Prior Publication Data
US 2013/0169287 A1    Jul. 4, 2013

(30) Foreign Application Priority Data

Aug. 11, 2010  (DE) .................. 10 2010 036 941

(51) Int. Cl.
*G01R 31/00* (2006.01)
*G01R 31/327* (2006.01)
(Continued)

(52) U.S. Cl.
CPC ......... *G01R 31/00* (2013.01); *G01R 31/3275* (2013.01); *G01R 31/3278* (2013.01); *H01H 47/325* (2013.01); *G01R 31/06* (2013.01)

(58) Field of Classification Search
CPC ............ G01R 31/02; G01R 31/06; H02P 6/14; H01H 47/325; F01L 9/04; G05B 19/19;
(Continued)

(56) References Cited

U.S. PATENT DOCUMENTS 4,696,265 A * 9/1987 Nohira .................... F01L 1/143
                                                              123/90.12
4,827,718 A * 5/1989 Terui ......................... F02D 9/04
                                                              123/359
(Continued)

FOREIGN PATENT DOCUMENTS

CN    1286128 C    11/2006
DE    4109233 A1    9/1992
(Continued)

OTHER PUBLICATIONS

PCT Search Report for PCT Serial No. PCT/DE2011/075186 dated Feb. 24, 2012.
(Continued)

*Primary Examiner* — Patrick Assouad
*Assistant Examiner* — Sean Curtis
(74) *Attorney, Agent, or Firm* — McCormick, Paulding & Huber LLP (57) ABSTRACT

The invention relates to a method (3) for determining (33) a state characteristic value (28) of a electric device (4) controlled by a temporally variable control signal (17). The at least one state characteristic value (28) is determined using the frequency of the temporally variable control signal (17) and/or the switching characteristics of the temporally variable control signal (17).

20 Claims, 3 Drawing Sheets

(51) Int. Cl.
   *G01R 31/06* (2006.01)
   *H01H 47/32* (2006.01)

(58) Field of Classification Search
   CPC .......... G05B 11/28; F16K 31/0675; F02D 2041/2024; F02D 2041/2058; F02D 41/20; H01F 2007/185
   USPC .................. 324/511; 361/154, 160, 206
   See application file for complete search history.

(56) References Cited

U.S. PATENT DOCUMENTS

| | | | | |
|---|---|---|---|---|
| 4,838,022 | A * | 6/1989 | Terui | F02D 9/04 123/479 |
| 4,884,025 | A * | 11/1989 | Hausler | H02M 1/088 324/762.01 |
| 4,970,622 | A * | 11/1990 | Buchl | H01F 7/1805 123/490 |
| 4,977,508 | A * | 12/1990 | Tanaka | H02P 29/0016 123/192.1 |
| 5,008,773 | A * | 4/1991 | Yoshida | H01F 7/18 361/160 |
| 5,053,911 | A * | 10/1991 | Kopec | G01R 31/2829 123/490 |
| 5,311,548 | A * | 5/1994 | Nikolaus | H02M 3/156 340/12.16 |
| 5,521,593 | A * | 5/1996 | Kumar | G01R 31/263 323/245 |
| 5,592,921 | A * | 1/1997 | Rehbichler | F02D 41/20 123/490 |
| 5,737,199 | A * | 4/1998 | Kanamori | H02H 7/122 322/28 |
| 5,942,892 | A * | 8/1999 | Li | H01F 7/1844 324/207.16 |
| 5,992,383 | A * | 11/1999 | Scholten | F02D 11/10 123/399 |
| 5,998,954 | A * | 12/1999 | Scholten | F02D 11/10 318/599 |
| 6,034,499 | A * | 3/2000 | Tranovich | H02P 6/14 318/254.2 |
| 6,092,495 | A * | 7/2000 | Hackett | F01L 9/02 123/198 D |
| 6,102,364 | A * | 8/2000 | Busato | F16K 31/0675 251/129.05 |
| 6,208,497 | B1 * | 3/2001 | Seale | F01L 9/04 361/154 |
| 6,275,368 | B1 * | 8/2001 | Yamada | H01F 7/1805 361/140 |
| 6,291,954 | B1 * | 9/2001 | Joch | H02P 7/04 318/434 |
| 6,310,754 | B1 * | 10/2001 | Busato | F16K 31/0675 251/129.05 |
| 6,314,473 | B1 * | 11/2001 | Singer | G11B 5/5556 318/560 |
| 6,406,102 | B1 * | 6/2002 | Arnold | B60T 7/042 303/20 |
| 6,427,971 | B1 * | 8/2002 | Kawabe | F01L 9/04 137/486 |
| 6,474,620 | B2 * | 11/2002 | Cornell | F01L 9/02 123/90.12 |
| 6,493,204 | B1 * | 12/2002 | Glidden | B60T 8/36 361/154 |
| 6,498,409 | B1 * | 12/2002 | Collier-Hallman | G01D 5/145 310/68 B |
| 6,545,852 | B1 * | 4/2003 | Arnold | B60T 17/22 361/152 |
| 6,548,981 | B1 * | 4/2003 | Ishii | H02K 11/04 318/15 |
| 6,560,528 | B1 * | 5/2003 | Gitlin | F02D 41/2422 123/406.62 |
| 6,604,497 | B2 * | 8/2003 | Buehrle, II | F01L 9/02 123/90.11 |
| 6,769,385 | B1 * | 8/2004 | Chang | F01L 1/16 123/90.12 |
| 6,895,997 | B2 * | 5/2005 | Qu | G05B 19/19 137/554 |
| 6,899,313 | B2 * | 5/2005 | Carrillo | F16K 31/0665 123/90.12 |
| 6,942,469 | B2 * | 9/2005 | Seale | F01L 9/04 417/413.1 |
| 6,966,285 | B1 * | 11/2005 | Sun | F01L 9/02 123/90.11 |
| 7,006,911 | B2 * | 2/2006 | Wilhelm | F02D 35/0007 123/568.12 |
| 7,075,290 | B2 * | 7/2006 | Collier-Hallman | G01P 3/487 310/68 B |
| 7,171,946 | B1 * | 2/2007 | Watanabe | F02D 11/00 123/399 |
| 7,188,701 | B2 * | 3/2007 | Patankar | B62D 5/0463 180/446 |
| 7,405,917 | B2 * | 7/2008 | Ahrens | F16K 31/06 324/418 |
| 7,543,679 | B2 * | 6/2009 | Colosky | B62D 15/0215 180/444 |
| 7,600,494 | B2 * | 10/2009 | Gale | F01L 9/04 123/90.11 |
| 7,721,690 | B2 * | 5/2010 | Liu | F01L 1/267 123/90.12 |
| 7,743,748 | B2 * | 6/2010 | Ostman | F02D 41/20 123/467 |
| 7,782,590 | B2 * | 8/2010 | Bedingfield | H01F 7/1805 361/144 |
| 8,026,713 | B2 * | 9/2011 | Moriya | H05B 6/666 324/120 |
| 8,076,874 | B2 * | 12/2011 | Ueno | B60L 7/14 318/139 |
| 8,203,300 | B2 * | 6/2012 | Krah | G05B 11/28 318/634 |
| 8,207,700 | B2 * | 6/2012 | Syrman | H02P 3/26 187/288 |
| 8,585,012 | B2 * | 11/2013 | Labataille | F02M 26/48 251/129.04 |
| 2002/0046717 | A1 * | 4/2002 | Buehrle, II | F01L 9/02 123/90.12 |
| 2004/0016461 | A1 * | 1/2004 | Qu | G05B 19/19 137/554 |
| 2004/0083993 | A1 * | 5/2004 | Seale | F01L 9/04 123/90.11 |
| 2004/0124796 | A1 * | 7/2004 | Bailey | H02K 1/141 318/400.4 |
| 2005/0031132 | A1 * | 2/2005 | Browning | H04R 29/003 381/59 |
| 2005/0031134 | A1 * | 2/2005 | Leske | H04R 29/003 381/59 |
| 2005/0031137 | A1 * | 2/2005 | Browning | H04R 29/00 381/96 |
| 2005/0031139 | A1 * | 2/2005 | Browning | H04R 3/002 381/96 |
| 2005/0031140 | A1 * | 2/2005 | Browning | H04R 3/08 381/96 |
| 2005/0034691 | A1 * | 2/2005 | Chang | F01L 9/02 123/90.12 |
| 2005/0180084 | A1 * | 8/2005 | Rober | H01H 47/325 361/154 |
| 2005/0185358 | A1 * | 8/2005 | Machida | F01L 13/0026 361/160 |
| 2005/0218845 | A1 * | 10/2005 | Okamoto | H02P 6/10 318/400.12 |
| 2008/0035870 | A1 * | 2/2008 | Wygnanski | F01L 1/185 251/129.15 |
| 2008/0143346 | A1 * | 6/2008 | Rober | H01F 7/1844 324/654 |
| 2008/0285681 | A1 * | 11/2008 | Sorrells | H03F 1/0294 375/297 |
| 2009/0015980 | A1 * | 1/2009 | Fukano | F16K 31/0675 361/194 |
| 2009/0189555 | A1 * | 7/2009 | Chen | H02P 21/0089 318/400.07 |

(56) References Cited

U.S. PATENT DOCUMENTS

| | | | | |
|---|---|---|---|---|
| 2010/0141198 | A1* | 6/2010 | Krah | G05B 11/28 318/636 |
| 2011/0025235 | A1* | 2/2011 | Marignetti | H01F 7/1844 318/129 |
| 2011/0175620 | A1* | 7/2011 | Letas | G01R 31/02 324/511 |
| 2013/0145926 | A1* | 6/2013 | Koeckemann | F15B 11/0426 91/363 R |
| 2014/0216419 | A1* | 8/2014 | Wirkowski | F02D 41/20 123/506 |

FOREIGN PATENT DOCUMENTS

| | | |
|---|---|---|
| DE | 19858697 A1 | 7/2000 |
| DE | 10158846 A1 | 7/2003 |
| DE | 10250397 A1 | 5/2004 |
| DE | 102004022999 B3 | 12/2005 |
| DE | 102008036113 A1 | 4/2009 |
| EP | 0376247 A2 * 4/1990 | ............... G01N 1/14 |
| EP | 0376247 A2 * 7/1990 | ........... F04B 11/0033 |
| EP | 0400389 A2 12/1990 | |
| EP | 400389 A2 * 12/1990 | |
| GB | 494236 10/1938 | |
| JP | 2002516423 A 6/2002 | |
| JP | 2007318948 A * 12/2007 | |
| JP | 2007318948 A * 12/2007 | |
| JP | 2010-520130 A 2/2015 | |
| WO | 91/05163 A1 4/1991 | |
| WO | WO-2012041308 A1 * 4/2012 | ......... G01R 31/3275 |
| WO | WO 2012041308 A1 * 4/2012 | ......... G01R 31/3275 |

OTHER PUBLICATIONS

Muhammed Fazlur Rahman et al., Position Estimation in Solenoid Actuators, IEEE Transactions of Industry Applications, vol. 32, No. 3, May/Jun. 1996, pp. 552-559.

English translation of Korean Office Action dated Jun. 19, 2017 for corresponding Korean application.

* cited by examiner

METHOD AND DEVICE FOR DETERMINING THE STATE OF AN ELECTRICALLY CONTROLLED VALVE

CROSS REFERENCE TO RELATED APPLICATIONS

This application is entitled to the benefit of and incorporates by reference essential subject matter disclosed in International Patent Application No. PCT/DE2011/0075186 filed on Aug. 4, 2011 and German Patent Application No. 10 2010 036 941.1 filed Aug. 11, 2010.

TECHNICAL FIELD

The invention concerns a method for determining at least one state characteristic value of an electrical device controlled at least sometimes and/or at least partly with a temporally varying control signal. Furthermore, the invention concerns an electrical control device for at least occasional and/or at least partial determination of at least one state characteristic value of an electrical device actuated with a temporally varying control signal.

BACKGROUND

At present, the most diverse kinds of electrical devices are actuated by using an electric current.

For example, if an electrical device is supposed to take on a different state in dependence on certain metered values and/or at different times, the actuating of the electrical device can occur by using temporally varying control signals. Then, depending on the type of control signal imposed, the electrical device as a rule takes on a particular state. If is possible for there to be a certain length of time (a so-called time delay) between the imposing of a control value that is necessary or appropriate for a particular state of the electrical device and the eventual adopting of the corresponding state. The size of the time delay may depend not only on the kind and design of the electrical device, but also in particular on the required size of the change in state of the electrical device.

One problem with such an actuating of electrical devices is, in particular, that one would like to know when (and perhaps whether) the electrical device takes on the desired state. Thus, for example, it can happen that the electrical device cannot even adopt the desired state, for example, due to a technical flaw or due to an unusually strong countervailing force. But even when the electrical device eventually adopts the desired state at a particular time, the time delay can be different in length. But for many applications it is desirable to have (or not exceed) a particular, definite delay time.

Thus, in many cases it proves to be not enough to have a simple actuating of an electrical device with a time-varying control signal.

One way [of obtaining] information as to the current state of the electrical device is to provide special metering sensors that report the current state of the electrical device to a control unit. However, in many instances this technique is problematical, since the metering sensors often involve a sometimes sizeable expense outlay. Furthermore, due to tight space availability, the installation of a metering sensor is often impossible or only extremely problematical.

Another fundamental possibility in many cases is to use the time variable control signal itself, which is used for actuating the electrical device, for at least approximate detection of the state of the electrical device (and thus to use the electrical device itself as a kind of "intrinsic metering sensor"). Now, the measuring device (or parts thereof) can be moved from certain especially undesirable (such as especially cramped) areas to areas less critical in regard to the construction space. With such a method, it is sometimes possible to resort to already existing components, or those which have to be provided any way, which can reduce the costs.

One example among many of such electrical devices are electrical actuators for valves, such as are used for motors and pumps, especially for internal combustion engines, hydraulic motors, compressors and hydraulic pumps, or for switching applications in various hydraulic systems or fluid-carrying systems. In such technical devices, one would like not only to actuate different switching states of the valves controlled by means of the actuators, but also in particular obtain a feedback as to whether a switching process has actually taken place and preferably also when the switchover occurred (especially, when it was completed). With a knowledge of such quantities, better control algorithms can be utilized and suitable steps can be taken in event of malfunctions.

Proposals have already been made for electrical actuators whose position can be measured by "intrinsic" sensors.

Thus, for example, a method for estimating the position of a magnetic armature in a coil was proposed by M. F. Rahman, N.C. Cheung and K. W. Lim in the publication "Position Estimation in Solenoid Actuators" in IEEE Transactions on Industry Applications, Vol. 32, No. 3, May/June 1996. The authors describe that the inductance of the coil changes as a function of the position of the magnetic armature arranged movably therein and at first it increases. After a certain time, the inductance drops once more due to saturation. Based on a measurement of the imposed electric current, the authors thus deduce the position of the magnetic armature inside the coil. However, the problem with the method described here is that the proposed measurement method only provides usable results for quasi-stationary systems, as the authors themselves say. But for many technical systems, this limitation does not apply.

Another proposal was made, for example, in the U.S. patent application US 2008/0143346 A1. Here, based on the rising slope of the electric current imposed on an electromagnetic actuator, one infers the position of the actuator. But the method described here requires knowledge of definite starting positions. Starting from these positions, the position change is more or less "integrated up". Disturbances, such as those in the form of a no longer completely opening or closing valve, can hardly be detected with the proposed method. Furthermore, the method described there is likewise only suited to quasi-stationary systems.

Thus, a need still exists for an improved method for determining a state of an electrical device actuated by a time-varying control signal, especially in regard to the position of an electrically controlled actuator. In similar manner, there is also a need for an improved control device for an actuator.

SUMMARY

The problem of the invention is thus to propose a method which is improved over the prior art for determining at least one state characteristic value of an electrical device actuated at least sometimes and/or at least partly with a time-varying control signal. Furthermore, the problem of the invention consists in proposing an electrical control device that is improved over the prior art for at least occasional and/or at least partial determination of at least one state characteristic value of an electrical device actuated with a time-varying control signal.

The invention solves the problem.

It is proposed to carry out a method for determining at least one state characteristic value of an electrical device actuated at least sometimes and/or at least partly with a time-varying control signal in such a way that the at least one state characteristic value is determined at least sometimes and/or at least partly by using the frequency of the time-varying control signal and/or the switching characteristics of the time-varying control signal. The state characteristic value being determined can be any given state characteristic value, especially a direct state characteristic value (i.e., a state characteristic value that directly pertains to the electrical device). For example, such a direct state characteristic value can be an electrical state of the electrical device (current strength, inductance, temperature or the like). But it can also be an indirect state (i.e., a state characteristic value that does not directly pertain to the electrical device), such as the position, the velocity, the fluid flow rate or the like of a mechanical subassembly, say, connected to the electrical device (such as a valve). The electrical device itself can likewise be basically any given electrical device. The electrical device, in turn, can be operated in "standalone" mode, or be connected to en integrated with) other subassemblies, such as mechanical ones. This also includes cases, in particular, where the electrical device forms an integrated functional unit with certain mechanical components, such as a magnetic armature arranged movably in a magnetic field of an electrical coil. The time-varying control signal can likewise be basically any given electrical signal, other than a (permanent) electrical d.c. voltage. Typically, the time-varying control signal has a frequency that is at least sometimes and/or at least partly>0.1 Hz, >0.5 Hz, >1 Hz, >2 Hz, >5 Hz, >10 Hz, >20 Hz, >50 Hz, >100 Hz, >200 Hz, >500 Hz, >1 kHz, >2 kHz, >3 kHz, >4 kHz, >6 kHz and/or >6 kHz (where in all instances the value itself can be included in the figure). By a time-varying control signal is expressly meant not only "pure" alternating voltages, but also in particular electric voltage patterns with a d.c. voltage component (possibly also a high one), on which an alternating voltage component is superimposed. For sake of completeness, it should also be pointed out that the alternating voltage (or the alternating voltage component) can certainly vary from amplitude to amplitude in terms of its height, its length, its frequency and/or its signal shape. The time-varying control signal can actuate the electrical device (at least sometimes and/or at least partially) in any desired manner, directly and/or (at least sometimes and/or at least partially) indirectly. Thus, it is conceivable for the control signal to be a current that flows, for example, in an electrical coil. Likewise, however, the control signal can also be a current that is used, for example, as the input signal for a switching logic, as an input signal for a (power) transistor (or for a similar electronic circuit component). The inventors have found, to their own surprise, that it is possible in especially easy manner to determine many at least of the state characteristic values with astonishingly high accuracy by using for this, at least sometimes and/or at least partially, the frequency and/or the switching characteristics of the time-varying control signal. By frequency of the time-varying control signal is meant not only a full cycle length of an essentially periodic signal. In particular, a frequency can also mean the interval between two (or more) passages through zero or especially prominent points of the control signal curve. It is also possible for the control signal to also have, say, two (or possibly more) especially prominent switching states, and to use the relationship (such as the temporal relationship) of the two (or more) prominent switching states to each other in order to ascertain the state characteristic value. In particular, this can involve the so-called "duty cycle" of a pulse width modulated signal.

If is preferable for the time-varying control signal to be at least sometimes and/or at least partially a pulselike control signal and/or at least sometimes and/or at least partially a cyclical control signal. In particular, it can be at least sometimes and/or at least partially a pulse width modulated type control signal and/or at least sometimes and/or at least partially a square-wave control signal. By a pulselike control signal is meant in particular a signal that has preferably only one on and off state (that is a kind of binary signal). It is also possible, of course, to provide "intermediate stages" and/or even negative voltage values. It is also possible to superimpose a d.c. voltage component (possibly varying with a different frequency) on the control signal. By "pulselike" is meant not only the occurrence of brief pulses in time, but also one can provide relatively long-lasting pulses (especially in relation to the "off times" of the control signal. By a cyclical control signal is meant not only a signal which repeats itself more or less identically after expiration of a period or a certain time. Instead, this also means signals that repeat in "qualitative respect". For example, when the control signal consists of a sequence of square-wave pulses with different frequency and different width, this also can be interpreted as a cyclical control signal in the sense of this specification. Preferably, it can also be a pulse width modulated type control signal. By this is meant not only pulse width modulated control signals in the strict sense, whose frequency usually remains constant, and only the switching characteristics of the "on phases" and the "off phases" change relative to each other (so-called "duty cycle"). Rather, on the contrary, it is even preferable for a variation in the frequency to occur in addition to (or also in place of) such a variation in the duty cycle. It is likewise preferred for this to be in addition or alternatively a square-wave control signal. It should be pointed out that the mentioned control signals need not be present in their strict mathematical form. Instead, in all likelihood some signal distortion will result from certain componentry influences. For example, rising power-on edges of a square-wave control signal are generally deformed into an asymptotic power-on curve due to inductances. These and other effects can also result in certain signal distortions for the power-off edges and other signal characteristics, of course.

Furthermore, it is preferable for the electrical device to be at least sometimes and/or at least partially an electrical device having an induction mechanism, in particular, it is an electric motor mechanism, an electrical coil mechanism, and/or an actuator mechanism, preferably an actuator mechanism for a valve mechanism. First tests have shown that such electrical devices are especially suitable for use in conjunction with the proposed methods. Furthermore, there is often a space problem with such electrical devices, so that it is especially difficult—if not even next to impossible—to provide an additional metering sensor in these electrical devices. In this respect as well, the use of the proposed method proves to be especially advantageous.

Especially in this instance (but not necessarily limited to this) it is advantageous for the electrical device to be operated at least sometimes and/or at least partially in non quasistationary and/or nonstationary mode. As already mentioned at the outset, methods known to the prior art are generally confined to a use in quasistationary systems. But there is often an especially great need to obtain robust measurements of certain state characteristic values precisely in rapidly moving systems (i.e., systems not operated in quasistationary mode). For precisely when one needs to actuate a rapidly moving or rapidly changing technical device is it generally necessary to provide an especially accurate timing control, for example, due to reasons of efficiency. But for such an especially accurate timing control, one generally needs to have correspondingly rapid and precise metered data.

Furthermore, it is advantageous in the proposed method for the at least one state characteristic value to constitute at least sometimes and/or at least partially a measure of a position of at least parts of the electrical device, at least sometimes and/or at least partially a measure of reaching certain positions, especially prominent positions, of at least parts of the electrical device, at least sometimes and/or at least partially a measure of the velocity of at least parts of the electrical device and/or at least sometimes and/or at least partially a measure of the occurrence of at least one error event. The mentioned measurement values are especially advisable or helpful for a safe, efficient and low-wear operation of technical devices (especially rapidly changing technical devices). In the context of an actuator for a valve, this may be, for example, an (essentially) fully open state, an (essentially) fully closed state, a state of the valve in between these, and so on. An error event may occur, for example, when the valve cannot be fully opened or closed.

Furthermore, it is advantageous in the context of the proposed method if the electrical device is actuated at least sometimes and/or at least partially with a maximum current limiting method. The term "actuating" encompasses in this context not necessarily only the strict definition of the term (i.e., the meaning that a device is actuated without feedback or the like), but also encompasses feedback methods, the integrating of measurement values and the like (which is usually termed "regulating"). Thus, when a certain maximum current is passed (or threatens to be passed) due to the control signal, the strength of the control signal is decreased or preferably switched off for a certain length of time (generally resulting in so-called pulse width modulation). Such an actuating method is especially suitable for electrical devices that show certain "time delay effects", such as electrical devices with inductances, especially devices with large inductances, such as electrical coils and the like. Such pulse width modulation methods for the actuating of inductive electrical devices are already known as such in the prior art. But it is especially advantageous to use the switching behavior based on such a maximum current limiting at least sometimes and/or at least partially to determine at least one state characteristic value of an electrical device. A maximum current limiting is often necessary any way, since an actuating with an electric voltage often occurs, especially for inductances, which on account of the usually low ohmic resistance of inductive electrical mechanisms would ultimately result in too high a current (which, for example, could result in damage to the electrical device). Actuating with such a "too high" voltage is done in order to place the inductive electrical mechanism in its "maximum power-on" state especially quickly. A further advantage of the proposed method, moreover, is that it usually has little or no temperature dependency, especially for the temperature of the electrical mechanism. For example, when an electrical coil is used as the electrical mechanism, it often becomes substantially heated during operation. Such a heating can have an influence (for example) on an electrical resistance measurement of the electrical coil. Such an influence can be eliminated or reduced with the proposed method.

In particular, it is possible to implement the maximum current limiting process by use of a software-controlled comparator. But such a software-controlled comparator can also be used quite generally for other chores in the context of the method. In particular, it is possible with the software-controlled comparator for the time change in the time-variable control signal to occur directly in the comparator (for example, in a microcontroller or a computer-on-a-chip). For this, one can use an analog/digital converter (ADC), which is often available any way in the microcontroller (or some similar device). In this way, one can achieve an advantage not only in terms of cost and/or design space. Instead, by moving the measurements to the control unit itself, a larger number of measurement values can be detected, which are then available for diagnostic purposes. In this way, it is possible to provide more accurate output signals, especially a more accurate control signal. On the other hand, however, it can also be beneficial at times to implement the comparator as a "classical" hardware solution. Such hardware is available at low cost and furthermore it often has high speed. Moreover, it is possible, in event of an external realization of the comparator, to have lower computing capacity of the control circuitry and/or other componentry, so that on the whole costs can be saved and possibly also the computing accuracy can be increased.

Moreover, it is advantageous in the method to use at least one electrical device, actuated with the time-varying control signal, at least sometimes and/or at least partially for an at least partially electrically switched hydraulic pump and/or for an at least partially electrically switched hydraulic motor. Such electrically switched hydraulic pumps and electrically switched hydraulic motors constitute a relatively new but highly promising design for hydraulic pumps and hydraulic motors. Such electrically switched hydraulic pumps and hydraulic motors are also known by the English terms "digital displacement pump" and "synthetically commutated hydraulic pump". Such pumps are described, for example, in GB 0 494 236 B1 and WO 91/05163 A1. Precisely in such pumps/motors, it is practically essential for their operation to provide electrically actuated fluid valves (inlet valves and/or outlet valves) which, on the one hand, have very large fluid flow cross sections, and on the other hand can be switched especially fast and precisely in time. It is also possible in this context for the valves to be subject to a certain amount of wear or aging behavior (possibly also due to external factors). Accordingly, the closing time behavior of an electrically actuated valve can also change over time in a certain range. Now, if the switching behavior can be measured making use of the presently proposed method, a change in the valve can be factored in for later actuation pulses. In this way, it is possible in a simple and inexpensive manner to provide an electrically switched hydraulic pump or electrically switched hydraulic motor that also have an especially good and exact pumping or driving behavior over a lengthy period of time.

Furthermore, it is advantageous in the proposed method when the at least one state characteristic value is determined at least sometimes and/or at least partially by a measurement of the absolute value of the switching frequency of the time-varying control signal and/or at least sometimes and/or at least partially by a measurement of a change in the switching frequency of the time-varying control signal and/or at least sometimes and/or at least partially by a measurement of the absolute value of the switching characteristics of the time-varying control signal and/or at least sometimes and/or at least partially by a measurement of a change in the switching characteristics of the time-varying control signal. First tests have shown that especially predictive and precise state characteristic values can be found by using such values.

Moreover, an electrical device for the at least sometimes and/or at least partial determination of at least one state characteristic value of an electrical device actuated by a time-varying control signal is proposed, which is designed and organized such that it performs a method of the above proposed type at least sometimes and/or at least partially. The electrical control device then has the already described benefits and properties in similar manner. In particular, it is also possible to modify the electrical control device suitably in the sense of the previous description.

In particular, it is possible for the electrical control device to be configured at least partially as an electronic control device, especially at least partially as a program-controlled computer mechanism. This can be a "classical" computer, such as PC, workstation, or the like. However, it is possible—and advantageous—for this to be configured at least partially as a so-called electronic microcontroller and/or computer-on-a-chip. On the other hand, however, it can also be advantageous to do without software-controlled mechanisms (for the most part or at least almost entirely). Thus, first tests have shown that this can produce better, faster and/or more economical structures, at least for many requirements.

Furthermore, it is proposed to actuate an electrically switched hydraulic pump and/or an electrically switched hydraulic motor by using at least sometimes and/or at least partially the above described method. In addition, or alternatively, it is proposed to configure an electrically switched hydraulic pump and/or an electrically switched hydraulic motor such that it has at least one electrical control device of the above described type. The resulting electrically switched hydraulic pump and/or electrically switched hydraulic motor then has the already above-described benefits and properties in similar manner. It is also possible to further modify the hydraulic pump or hydraulic motor in suitable manner in the sense of the above description. Merely for sake of completeness, it is mentioned that it is also entirely possible to configure an electrically switched hydraulic pump and/or an electrically switched hydraulic motor so that it can function at the same time as an electrically switched hydraulic motor or an electrically switched hydraulic pump, respectively. This also holds, moreover, for electrically switched hydraulic pumps and electrically switched hydraulic motors as have already been mentioned in the context of the description of the method.

BRIEF DESCRIPTION OF THE DRAWINGS

The invention shall be explained more closely below by means of advantageous sample embodiments and making reference to the enclosed drawing. There are shown.

DETAILED DESCRIPTION

Figure 1:
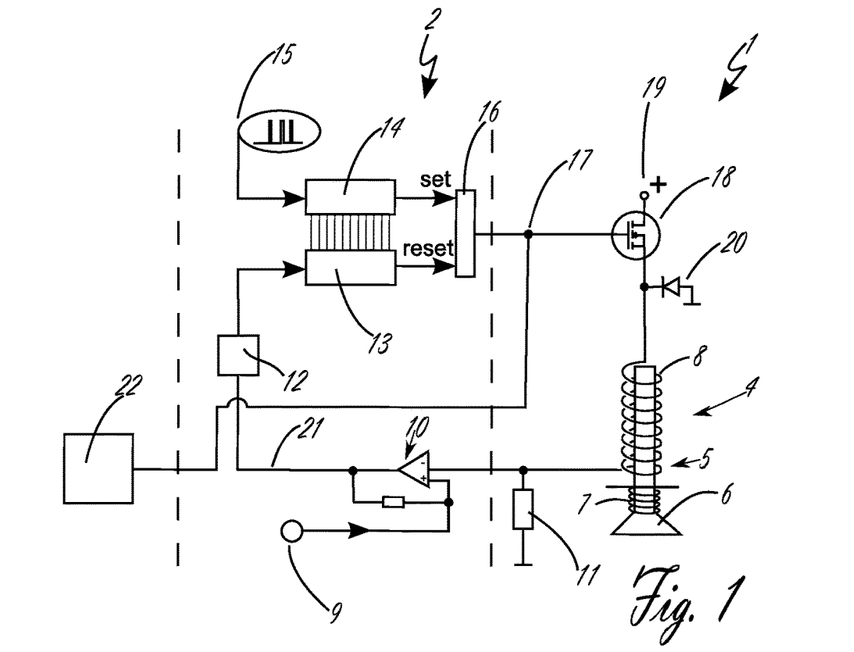
FIG. 1 is a first sample embodiment of a device suitable to implementing the method in a circuit diagram.

FIG. 1 shows a circuit diagram of a first possible circuit layout 1 of a control unit 2 for actuating a valve unit 4. The valve unit 4 in the present sample embodiment has an actuator 5 (formed essentially from an electric coil 8 in the present sample embodiment) with a valve body 6. In the present sample embodiment, the actuator 5 acts to move the valve body 6 upward (so that, for example, the valve head makes contact with a valve seat and the valve unit 4 is closed accordingly) when an electric current is applied to the electric coil 8. If, on the other hand, no electric current is flowing through the electric coil 8, a return spring 7 provided in the present sample embodiment brings about a return movement of the valve body 6. Of course, the valve body 6 can also be opened once more by external forces (such as a pressure difference at the valve head) or the like.

The actual switching of the actuator 5 (and thus the movement of the valve unit 4 or the valve body 6) on and off is initiated by the imposing of an input signal at the signal input 9. The input signal imposed at the signal input 9—depending on the voltage imposed—brings about a corresponding current in the electric coil 8. Thanks to a suitable circuitry logic, however, an overcontrolling of the electric coil 8 is prevented, so that under normal conditions this cannot be damaged even if an excessively strong and/or relatively long input signal (possibly also provided with a high duty cycle) is applied. In the sample embodiment of the circuit layout 1 shown in FIG. 1, the valve unit 4 is only supposed to be moved back and forth between an open and a closed state. Accordingly, only a binary signal (with suitable voltage in the power-on state) is applied to the signal input 9. Of course, it is also possible to provide electrical devices of different design in combination with the circuit layout 1 and/or also to realize intermediate positions of the electrical device (in which case it need not necessarily be a valve unit 4).

The input signal furnished by the signal input 9 is applied to the non-inverting input of an operational amplifier 10. At the inverting input of the operational amplifier 10 the voltage falling across a shunt resistor 11 is applied, being a measure of the current flowing through the electric coil 8 of the actuator 5 (shunt resistor 11 and electric coil 8 form a voltage divider circuit). Depending on the difference of the two input voltages at the operational amplifier 10, the result is an output voltage 21 whose magnitude is the voltage corresponding to the difference. The output voltage 21 of the operational amplifier 10 is taken to an analog/digital converter 12 and digitized. The digital value is placed in a comparison register 13. The comparison register 13 is in communication with a counting register 14, which counts the signals of a clock signal 15. Depending on the outcome of the comparison (i.e., counting register 14>comparison register 13 or counting register 14<comparison register 13) a flip flop 16 is switched on or off appropriately. Since the counting register 14 has only a finite length, the counting register 14 overflows at a certain time, so that it is again reset to 0. In addition to this or optionally, it is also possible to set the counting register 14 at 0 by applying a special (input) signal. For example, this can be a signal that is furnished by a separate input line (not shown in FIG. 1) and/or which constitutes a distinct reset signal. But it is likewise conceivable (in addition or alternatively) for a resetting of the counting register 14 to occur, for example, from a passage through zero of a voltage signal (especially a voltage signal supplied to signal line 9) (of course, instead of a passage through zero of the voltage signal also basically any other value can be chosen). Finally, a clocked, pulse width modulated control signal 17 is produced at the output of the flip flop 16. The pulse width modulated control signal 17 actuates a switching transistor 18, which applies the circuit through the actuator 5 to a voltage source 19 or cuts it off from this. Based on the inductance of the electrical coil 8, in combination with the freewheeling diode 20, a current strength is set in the actuator 5, corresponding to the pulse width ratio (so-called duty cycle) of the pulse width modulated control signal 17.

However, the pulse width modulated control signal 17 is not taken only to the switching transistor 18, but also to an electronic evaluation unit 22. Based on the pulse width ratio and/or the frequency of the pulse width modulated control signal 17, this calculates the position of the valve body 6. In particular, the evaluation electronics 22 registers not only the particular absolute value of frequency or pulse width ratio of the pulse width modulated control signal 17, but also in particular abrupt changes in frequency and/or pulse width ratio of the pulse width modulated control signal 17. It should be pointed out that it is also entirely possible to use the output signal 21 of the operational amplifier 10 as the input signal for the evaluation unit 22, since the current passing through the electrical coil 8 also still has the ripple factor of the pulse width modulated control signal 17 (albeit with a distinctly lesser intensity, and in addition a d.c. voltage component is also superimposed on it). Hence, the pulse width modulated control signal 17 can also be used "in part".

Figure 2:
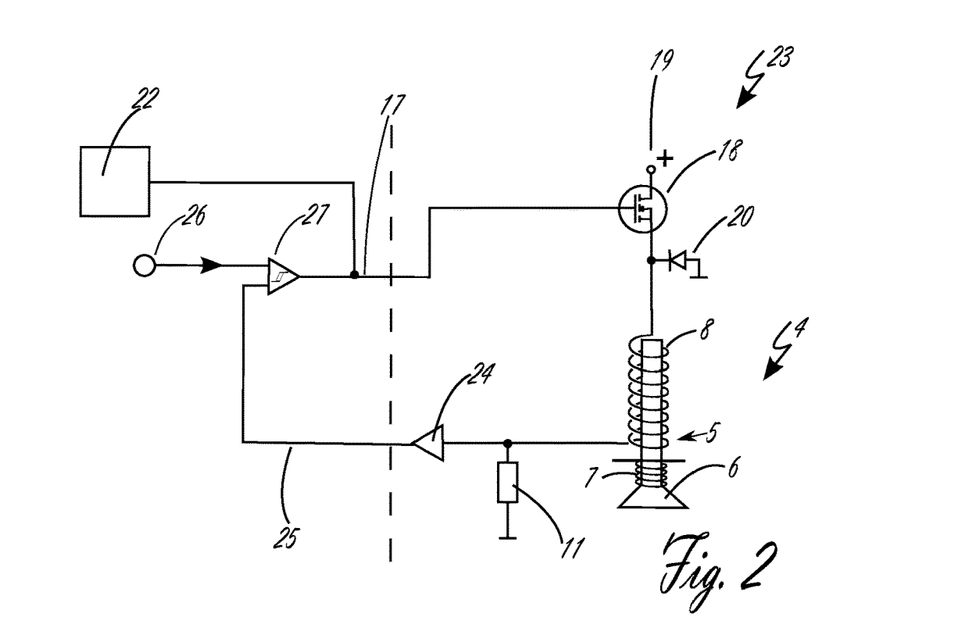
FIG. 2 is a second sample embodiment of a device suitable to implementing the method in a circuit diagram.

FIG. 2 shows a second, preferred sample embodiment for a circuit layout 23 for actuating a valve unit 4. The valve unit 4 in the present sample embodiment is identical to the valve unit 4 shown in FIG. 1. Of course, it is possible for the valve units 4 depicted in FIGS. 1 and 2 to also have a different layout, or to use instead of the valve unit 4 a totally different type of electrical device.

Similar to the sample embodiment of a circuit layout 1 as shown in FIG. 1, in the present sample embodiment of a circuit layout 23 the voltage dropping across a shunt resistor 11 is also used as a measure of the current flowing through the electrical coil 8. At first, the voltage dropping at the shunt resistor 11 is preamplified in a preamplifier 24. The output signal of the preamplifier 24 thus constitutes the actual signal 25 for a comparator 27, which is implemented in the present case by software in a microcontroller. The software implementation is such that the comparator 27 has a hysteresis (which is shown in FIG. 2 by a corresponding symbol in the comparator circuit symbol 27). Furthermore, a setpoint signal 26 is applied at the software-implemented comparator 27. Based on a comparison of setpoint signal 26 and actual signal 25 (factoring in a time hysteresis), a control signal 17 is generated, which is pulse width modulated. The modulation of the pulse width modulated control signal 17 is modulated not only "classically" in regard to the pulse width ratio (duty cycle), but also in terms of its frequency.

In order to process the input signals (setpoint signal 26 and actual signal 25) numerically by software, the comparator 27 has—if required—an analog/digital converter at its inputs. In the sample embodiment shown in FIG. 2, the setpoint signal 26 is already in digital form. Accordingly, the corresponding input of the comparator 27 has no analog/digital converter. Therefore, only the analog signal coming from the preamplifier 24 has to be converted into a digital form. Optionally, it can also be advantageous for the conversion from analog to digital form to occur already in or immediately after the preamplifier 24. Accordingly, no analog/digital converter is needed in the comparator 27 any more.

Similar to the sample embodiment of a circuit layout 1 as shown in FIG. 1, the circuit layout 23 shown in FIG. 2 also has an evaluation unit 22, which infers the current position of the valve body 6 based on the frequency and/or the pulse width ratio of the control signal 17. At the same time, the control signal 17 is applied to the input of a switching transistor 8, so that in this way the current flowing through the actuator 5 is regulated accordingly. A voltage source 19 and a freewheeling diode 20 are also provided, similar to the sample embodiment shown in FIG. 1.

The benefit of the software design of the comparator 27 shown in FIG. 2 is that a larger quantity of information is present in the comparator 27. Hence, several properties of setpoint signal 26 and actual signal 25 can be processed. It is also very easy to change the magnitude of the setpoint signal 26, for example, in order to cancel out drift effects during permanent duty of the valve unit 4. For this, the value of a corresponding variable can simply be changed.

Moreover, it is also possible for certain properties of the setpoint signal 26 and/or the actual signal 25 as detected by the comparator 27 to be provided in digital form to the evaluation unit 22, so that a more precise result can be achieved in the evaluation unit 22. For this, a data line can be provided between comparator 27 and evaluation unit 22 (not shown in the present case). It is also possible for evaluation unit 22 and comparator 27 to be designed, for example, as software modules on a single hardware unit (such as a computer-on-a-chip or a microcontroller).

Figure 3:
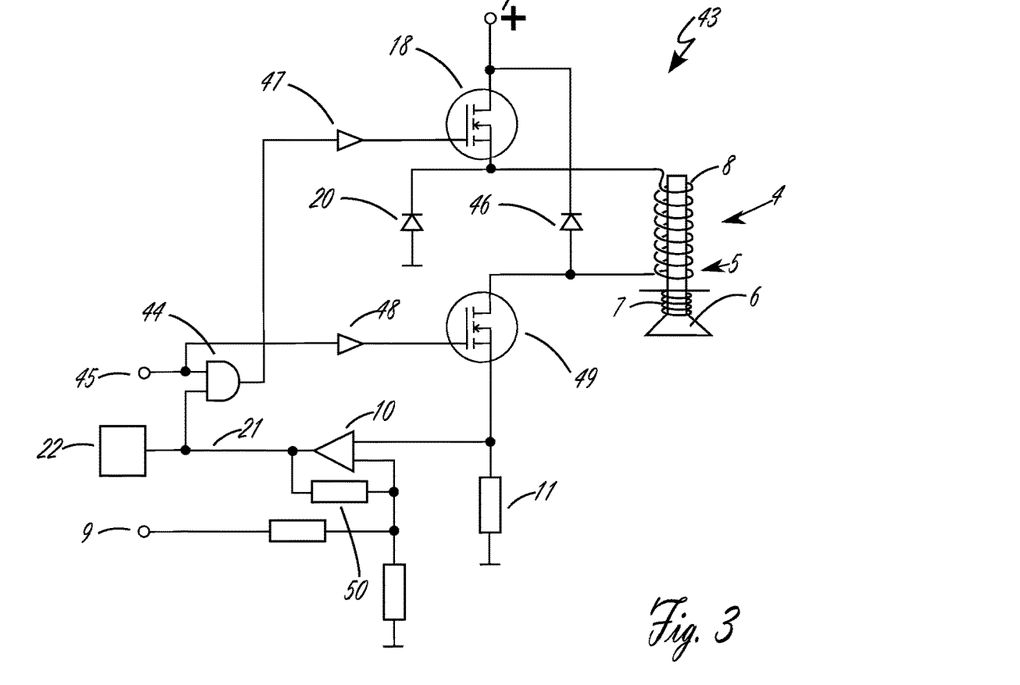
FIG. 3 is a third sample embodiment of a device suitable to implementing the method in a circuit diagram.

FIG. 3 shows a third, especially preferred sample embodiment of a circuit layout 43 for actuating a valve unit 4. The circuit layout 43 shown in FIG. 3 for the most part resembles the circuit layouts 1, 23 shown in FIGS. 1 and 2, especially the circuit layout 1 shown in FIG. 1. Components or subassemblies that have an identical function and/or an identical layout are provided with identical reference numbers and not described once more in detail, to avoid needless repetition.

A major difference between the circuit layouts 1, 23 described thus far and the presently depicted circuit layout 43 is that use is made, in particular, of standard components 18, 44, 46, 47, 48, 49, which are configured as hardware components or subassemblies. Thus (apart from the evaluation unit 22), no use is made of a software control system.

The circuit layout 43 has two control inputs 9, 45, namely, a first signal input 9 and a logic input 45 (signal flag input). By the logic input 45, the actuator 5 can be switched on and off by means of a binary signal. In addition, a reference voltage can be applied via the signal input 9, by which one can set the maximum setpoint of the electric current flowing through the electrical coil 8 of the actuator 5. Because in the present sample embodiment the reference voltage does not need to be switched on and off, the circuit to generate the reference voltage can be particularly simple. The logic input 45, for example, can be actuated by an electronic control circuit (a so-called controller, not shown here). Of course, it is possible for the electronic control circuit to resort to output values of the evaluation unit 22 to generate a signal for the logic input 45.

When a signal is applied to the logic input 45 in the circuit layout 43 (which has the effect of closing the valve unit 4 fastened to the actuator 5), the second switching transistor 49 on the one hand is switched via the second amplifier circuit 48 to "conducting". The second switching transistor 48 remains connected through for as long as a signal is present at the logic input 45. The actual regulating task, i.e., the controlling of the current strength flowing through the electrical coil 8 of the actuator 5, is on the other hand realized by the first switching transistor 18 (as described more closely below).

Moreover, the signal at the logic input 45 has the effect that the logical AND circuit 44 for the output signal 21 of the operational amplifier 10 is "connected through". The output signal 21 of the operational amplifier 10 thus brings about through the first preamplifier 47 a switching on and off of the first switching transistor 18, and thus a releasing or a blocking of the electric current flowing through the electrical coil 8 of the actuator 5.

Immediately after imposing the signal at the logic input 45, the first switching transistor 18 at first switches to "conducting" (the second switching transistor 49 is likewise switched to "conducting"). The current strength through the electrical coil 8 of the actuator 5 rises steadily. Accordingly, the voltage across the shunt resistor 11 increases. The electrical voltage tapped off there is taken to the inverting input of the operational amplifier 10. At a certain current strength, the voltage tapped off at the shunt resistor 11 exceeds the reference voltage supplied across the signal input 9, which is taken to the non-inverting input of the operational amplifier 10. This has the effect that the output signal 21 of the operational amplifier 10 decreases, and thus the first switching transistor 18 is blocked. Due to the inductance of the electrical coil 8, the electric current through the electrical coil 8 is at first maintained (current flow through the first freewheeling diode 20 and the second switching transistor 49), but with rapidly diminishing current strength. This causes a drop in the voltage across the shunt resistor 11, so that the operational amplifier 10 again switches, and puts out an output signal 21. The "quickness" of the switching between the two switching states of the operational amplifier 10 is determined by the hysteresis of the operational amplifier 10, which is basically influenced by the magnitude of the feedback resistance 50. The external switching of the operational amplifier 10 is furthermore chosen in the present case such that the output signal 21 is basically a binary signal. Thus, the output signal 21 basically knows only the two states "on" and "off".

In this way, a current flow with predetermined setpoint current strength (the magnitude of the current strength is predetermined by the signal input 9) through the actuator 5 is accomplished. The current flow here has certain fluctuations about the actual setpoint current strength.

As already mentioned (and yet to be further discussed below), one can infer the switching state of the valve unit 4 from the frequency and the duty cycle of the output signal 21 of the operational amplifier 10. Accordingly, the output signal 21 is used not only for feedback, but is also taken to an evaluation unit 22. The information obtained from this evaluation unit 23 can also be used for feedback purposes, incidentally (for example, to vary the actuation signal over time, and thereby cancel out any drift due to wear or temperature drift).

If at a later time the valve unit 4 opens once more, the signal imposed at the logic input 45 is switched off. This has the effect that both the first switching transistor 18 (via the logical AND circuit 44) and the second switching transistor 49 are blocked. The inductance of the electrical coil 8, which at first tries to maintain the current flow, now "pumps" electric current from ground potential to the (relatively high) voltage potential of the voltage source 19 via the first freewheeling diode 20 and the second freewheeling diode 46. This brings about an especially fast decay in the current strength and thus an especially fast opening of the valve body 6. Thus, a fast cutoff function is achieved by the design with two switching transistors 19, 49.

Merely for sake of completeness it is pointed out that it is entirely possible to design the circuit layout 43 also without a second switching transistor 49 (and without the second amplifier circuit 48). But then the current flow through the electrical coil 8 of the actuator 5 decays more slowly; hence, the fast cutoff functionality is not as good.

Figure 4:
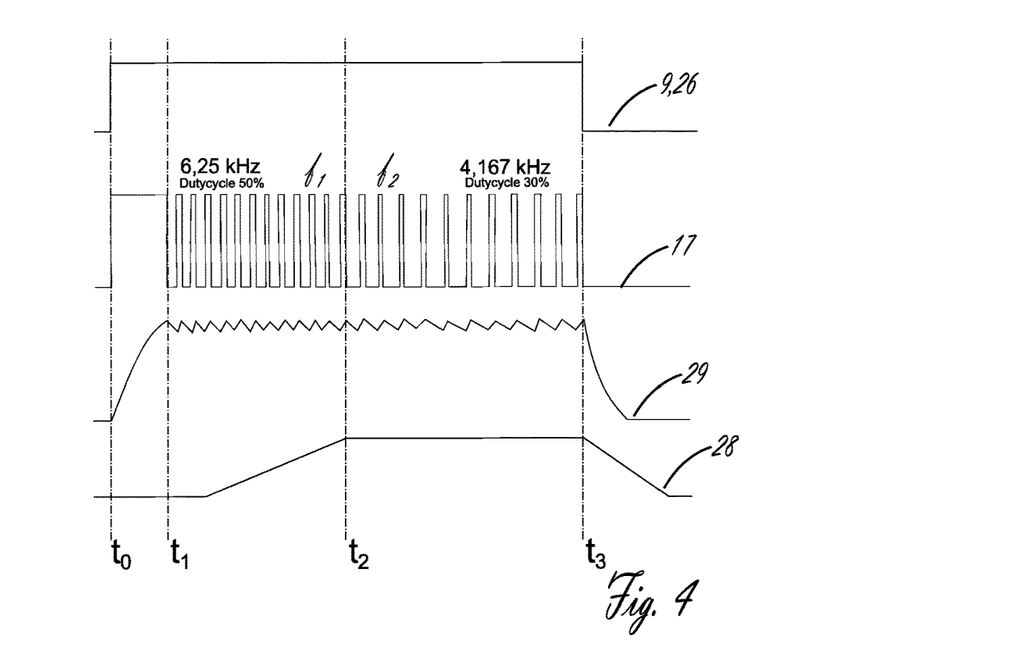
FIG. 4 is measurement results during the closing process of an electromagnetic actuator.

FIG. 4 shows the time course of the various signals in an actuating of a valve unit 4 making use of a circuit layout 1 per FIG. 1, a circuit layout 23 per FIG. 2, or a circuit layout 43 per FIG. 3 (while other circuit layouts are also conceivable). At time t0, an input signal 9, 26 of corresponding magnitude is applied. The valve 4 at this time is still in an open state, for example (shown in FIG. 4 by the valve position curve 28). The control unit 2 at first switches the control signal 17 to a "permanently" switched-on value. Due to the inductance of the electrical coil 8, it takes a certain time until the current 29 through the coil 8 rises and follows the control signal 17.

At time t1, the maximum permissible current strength 29 through the electrical coil 8 is reached. Accordingly, the control unit 2 changes the control signal 17 to a pulse width modulated signal with a particular switching frequency and a particular switching ratio (a particular "duty cycle"). This has the consequence that the current 29 through the electrical coil 8 (apart from a residual ripple) remains almost constant. As one can furthermore see from FIG. 4 (especially the valve position curve 28), the valve body 6 has begun to move. However, the valve unit 4 is not yet closed; the valve body 6 is accordingly still in movement.

At time t2, the valve unit 4 is now fully closed. (Of course, it is also possible for the "switching logic" of the valve unit 4 to be different. For example, in the case of a valve unit 4 that is opened by a current pulse, the valve unit 4 is still fully open at time t2. The other positions are "switched around" accordingly from the presently described embodiment.) This is well seen from the break in the valve position curve 28. Now, the inventors have found that this reaching of the end position of the valve body 4 results in a distinct change in the control signal 17 produced by the control unit 2. Initial measurements have revealed that both the frequency and the pulse width ratio of the control signal change significantly. This is evident in FIG. 4 from the altered form of the control signal 17 itself. Furthermore, it is clear from FIG. 4 that the time variation of the electric current 29 through the electrical coil 8 also changes (especially the frequency of the residual ripple changes significantly). Accordingly, the current signal 29 can also be used for a position evaluation of the valve body 6 or the like.

As long as the input signal 9, 26 remains switched on, nothing changes in the situation. The current strength 29 through the valve unit 4 remains constant, the control signal 17 does not change, and the position of the valve body 6 also remains constant (see valve position curve 28). Only when the input signal 9, 26 is again switched off (at time t3) is the control signal 17 for the switching transistor 18 "permanently" switched off, the current 29 through the electrical coil 8 decreases, and the valve body 6 of the valve unit 4 moves back to its starting position (see valve position curve 28).

With the experimental layout presented in FIG. 4, a change in the frequency of the control signal 17 from 6.25 kHz (valve body 6 still moving) to a frequency of 4.517 kHz (valve body 6 no longer moving; valve unit 4 fully closed)

was achieved in initial experiments. The pulse width ratio (the duty cycle) also changed significantly in these experiments. Thus, the pulse width ratio jumped from initially 50% to 30% within a very short span of time.

Thus, it is clearly apparent that both the control signal 17 and the actual current 29 through the electrical coil 8 constitute a very good input signal for an evaluation unit 22.

Figure 5:
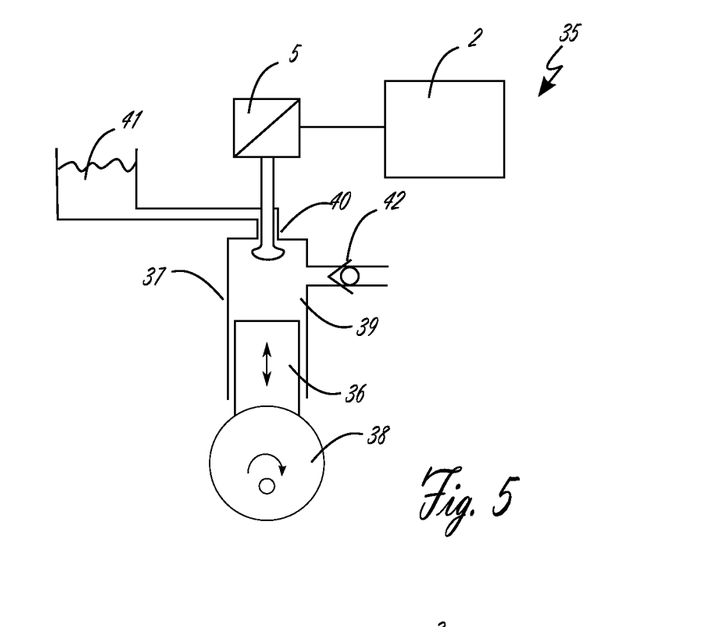
FIG. 5 is a schematic representation of one possible design for an electrically switched hydraulic pump.

Finally, FIG. 5 shows in a highly simplified schematic representation an electrically switched hydraulic pump 35. The electrically switched hydraulic pump 35 has a piston 36, which moves up and down in a cylinder 37 by means of an eccentrically arranged drive pulley 38 (the downward movement can result, for example, from a return spring, not shown here). Accordingly, the cavity 39 located in the cylinder 37 is increased and decreased in cycles.

If the cavity 39 increases by a downward movement of the piston 36, hydraulic oil will be sucked out from a reservoir 41 through an electrically controlled inlet valve 40. The electrically controlled inlet valve 40 can be, for example, the valve unit 4 shown in FIG. 1 or FIG. 2.

When the piston 36 has reached its lower dead center, for example, has moved beyond it, it will again move upward (into the cylinder 37) and accordingly the cavity 39 is decreased. The hydraulic oil present in the cavity 39 will at first be forced back into the reservoir 41 via the still open inlet valve 40. Thus, effectively no hydraulic oil will be pumped.

But the situation changes when the inlet valve 40 is closed by a corresponding control pulse. Now the hydraulic oil can no longer drain across the inlet valve 40. Hence, the hydraulic oil now leaves the cavity 39 via a simple one-way valve 42 in the direction of a high-pressure reservoir (not otherwise depicted at present).

The major difference between an electrically switched hydraulic pump 35 and a classical hydraulic pump with passive inlet and outlet valves is that the closing of the inlet valve 40 by means of the actuator 5 can be brought about at any given time. In this way, it is possible to vary the effectively pumped quantity of hydraulic oil in broad limits from one pump cycle to the next.

The inlet valve 40 (which, as already mentioned, can be configured according to a valve unit 4 represented in FIG. 1 or FIG. 2) is closed and opened again if desired via an actuator 5 (it being possible for the opening process to occur by a pressure difference in the hydraulic oil on either side of the inlet valve 40). The actuating of the actuator 5 (and thus the inlet valve 40) occurs especially by use of a control unit 2, as shown in FIG. 1 or FIG. 2.

FIG. 6 shows, again in schematic form, a flow chart 3 illustrating the process flow of the proposed method. In a first step 30, we read in an input signal (e.g., an input signal 9, 26; see FIGS. 1 and 2).

Figure 6:
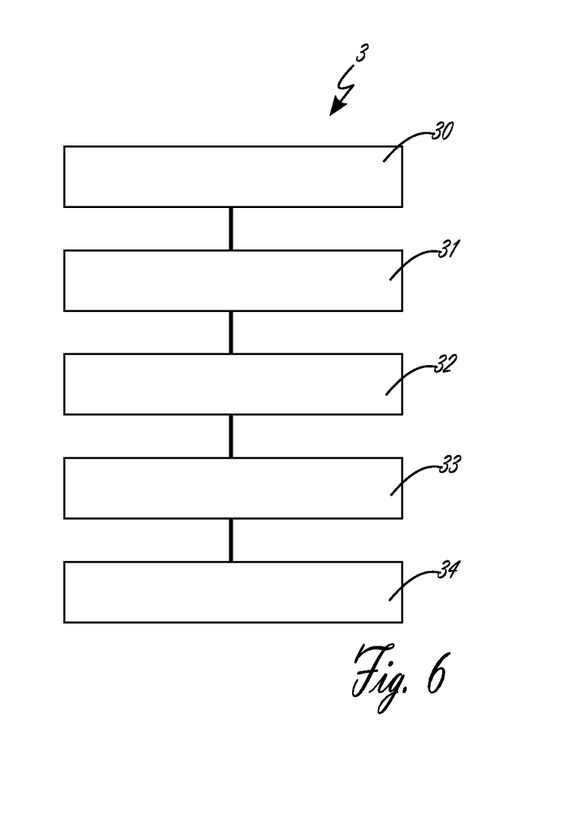
FIG. 6 is a flow chart of a method for determining the closing behavior of a valve.

This entered input signal 9, 26 (setpoint signal 26) is compared in a following step with the actual signal 25, which is supplied from the electrical device (such as a valve unit 4). Based on the comparison of setpoint versus actual 31 (for example, in a control unit 2), a suitable control signal (such as control signal 17) is calculated 32 and used to actuate the electrical device.

The control signal found in the calculation 32 is used not only to actuate the electrical device 4, but also in addition (say, at the same time) to calculate a state signal 33. For example, the state signal calculated 33 in this way can be a signal that the electrical device 4 has adopted a certain position (such as an end position).

The state signals obtained in this step 33 can then be used in a further process step 34, for example, for a fine-tuning.

Thus, for example, it often happens that many mechanical, electrical or other technical components have a certain drift over the course of time. But such a drift can be effectively counteracted by the fine-tuning in step 34. As a preferred example in this connection we can mention a change in the hold-back time for the next valve movement (the next "shot").

Although various embodiments of the present invention have been described and shown, the invention is not restricted thereto, but may also be embodied in other ways within the scope of the subject-matter defined in the following claims.

The invention claimed is:

1. A method for determining at least one state characteristic value of an electrical device comprising a microcontroller and a moveable subassembly actuated with a time-varying control signal generated by a control unit of the microcontroller, the method comprising:
   wherein the time-varying control signal is determined by comparing a first signal indicating a desired value of the at least one state characteristic value with a second signal indicating a current value of the at least one state characteristic value,
   wherein the at least one state characteristic value is determined by an evaluation unit of the microcontroller of the electrical device using at least one of the frequency of the time-varying control signal or the switching characteristics of the time-varying control signal, and
   wherein the at least one state characteristic value includes a measure of a current position of the moveable subassembly and a velocity of the moveable subassembly as the moveable subassembly moves between a first position at a first time and a second position at a second time.

2. The method according to claim 1, wherein the time-varying control signal is a pulselike control signal and/or a cyclical control signal, especially a pulse width modulated type control signal and/or a square-wave control signal.

3. The method according to claim 1, wherein the moveable subassembly of the electrical device includes an induction mechanism.

4. The method according claim 1, wherein the electrical device is operated in non-quasistationary and/or nonstationary mode.

5. The method according to claim 1, wherein the at least one state characteristic value further constitutes a measure of reaching certain positions, especially prominent ones, of at least parts of the electrical device, and/or a measure of the occurrence of at least one error event.

6. The method according to claim 1, wherein the electrical device is actuated with a maximum current limiting method.

7. The method according to claim 1, wherein at least one electrical device, actuated with the time-varying control signal, is used for an electrically switched hydraulic pump and/or for an electrically switched hydraulic motor.

8. The method according to claim 1, wherein the at least one state characteristic value is determined by a measurement of the absolute value of the switching frequency of the time-varying control signal and/or by a measurement of a change in the switching frequency of the time-varying control signal and/or by a measurement of the absolute value of the switching characteristics of the time-varying control signal and/or by a measurement of a change in the switching characteristics of the time-varying control signal.

9. An electrical device comprising:
a moveable subassembly configured to move between a first position and a second position; and
an electrical control device configured to actuate the moveable subassembly with a time-varying control signal;
wherein the electrical control device determines the time-varying control signal by comparing a first signal indicating a desired value of at least one state characteristic value of the electrical device with a second signal indicating a current value of the at least one state characteristic value;
wherein the electrical control device comprises an evaluation unit that determines the at least one state characteristic value of the electrical device by the time-varying control signal; and
wherein the at least one state characteristic value includes a measure of a current position of the moveable subassembly and a velocity of the moveable subassembly as the moveable subassembly moves between the first position at a first time and the second position at a second time.

10. The electrical device according to claim 9, wherein the electrical control device is configured as a program-controlled computer mechanism.

11. An electrically switched hydraulic device comprising:
a moveable subassembly configured to move between a first position and a second position; and
an electrical control device configured to actuate the moveable subassembly with a time-varying control signal, the electrical control device comprising a first switching transistor actuated by a first control input to generate the time-varying control signal applied to the moveable subassembly, and a second switching transistor actuated by a second control input to control an on/off state of the moveable subassembly;
wherein the electrical control device determines the time-varying control signal by comparing a first signal indicating a desired value of at least one state characteristic value of the electrically switched hydraulic device with a second signal indicating a current value of the at least one state characteristic value;
wherein the electrical control device comprises an evaluation unit that determines the at least one state characteristic value of the electrically switched hydraulic device by the time-varying control signal; and
wherein the at least one state characteristic value includes a measure of a current position of the moveable subassembly and a velocity of the moveable subassembly as the moveable subassembly moves between the first position at a first time and the second position at a second time.

12. The method according to claim 2, wherein the moveable subassembly of the electrical device includes an induction mechanism.

13. The method according claim 2, wherein the electrical device is operated in non-quasistationary and/or nonstationary mode.

14. The method according claim 3, wherein the electrical device is operated in non-quasistationary and/or nonstationary mode.

15. The method according to claim 2, wherein the at least one state characteristic value further constitutes a measure of reaching certain positions, especially prominent ones, of at least parts of the electrical device, and/or a measure of the occurrence of at least one error event.

16. The method according to claim 3, wherein the at least one state characteristic value further constitutes a measure of reaching certain positions, especially prominent ones, of at least parts of the electrical device, and/or a measure of the occurrence of at least one error event.

17. The method according to claim 4, wherein the at least one state characteristic value further constitutes a measure of reaching certain positions, especially prominent ones, of at least parts of the electrical device, and/or a measure of the occurrence of at least one error event.

18. The method according to claim 2, wherein the electrical device is actuated with a maximum current limiting method.

19. The method according to claim 3, wherein the electrical device is actuated with a maximum current limiting method.

20. The method according to claim 4, wherein the electrical device is actuated with a maximum current limiting method.

* * * * *